(12) United States Patent
Chang et al.

(10) Patent No.: US 10,256,811 B2
(45) Date of Patent: Apr. 9, 2019

(54) CASCODE SWITCH CIRCUIT INCLUDING LEVEL SHIFTER

(71) Applicant: Electronics and Telecommunications Research Institute, Daejeon (KR)

(72) Inventors: Woojin Chang, Daejeon (KR); Jong-Won Lim, Daejeon (KR); Dong Min Kang, Daejeon (KR); Dong-Young Kim, Daejeon (KR); Seong-il Kim, Daejeon (KR); Hae Cheon Kim, Daejeon (KR); Jae Won Do, Daejeon (KR); Byoung-Gue Min, Sejong-si (KR); Min Jeong Shin, Daejeon (KR); Hokyun Ahn, Daejeon (KR); Hyung Sup Yoon, Daejeon (KR); Sang-Heung Lee, Daejeon (KR); Jongmin Lee, Daejeon (KR); Sungjae Chang, Daejeon (KR); Yoo Jin Jang, Daejeon (KR); Hyunwook Jung, Daejeon (KR); Kyu Jun Cho, Daejeon (KR); Hong Gu Ji, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 14 days.

(21) Appl. No.: 15/654,792

(22) Filed: Jul. 20, 2017

(65) Prior Publication Data
US 2018/0145684 A1    May 24, 2018

(30) Foreign Application Priority Data

Nov. 22, 2016 (KR) .................. 10-2016-0156016
Feb. 16, 2017 (KR) .................. 10-2017-0021266

(51) Int. Cl.
*H03K 17/687* (2006.01)
*H03K 17/693* (2006.01)
(Continued)

(52) U.S. Cl.
CPC ............ *H03K 17/687* (2013.01); *G11C 5/14* (2013.01); *H03K 3/353* (2013.01);
(Continued)

(58) Field of Classification Search
USPC .......................................................... 327/55
See application file for complete search history.

(56) References Cited

U.S. PATENT DOCUMENTS 5,422,563 A * 6/1995 Pflueger .................. G05F 1/575
                                                     323/312
6,650,168 B1 * 11/2003 Wang ............... H03K 3/356113
                                                     327/333
(Continued)

*Primary Examiner* — Adam D Houston
(74) *Attorney, Agent, or Firm* — Rabin & Berdo, P.C.

(57) ABSTRACT

Provided is a cascode circuit including first and second transistors connected between a drain terminal and a source terminal in cascode form, a level sifter configured to change a voltage level of a switching control signal applied to a gate terminal and provide the changed switching control signal to a gate of the first transistor, a buffer configured to delay the switching control signal and provide the delayed switching control signal to a gate of the second transistor, and a first resistor connected between the level shifter and the gate of the first transistor.

14 Claims, 11 Drawing Sheets

(51) Int. Cl.
  *G11C 5/14* (2006.01)
  *H03K 19/0175* (2006.01)
  *H03K 3/353* (2006.01)
  *H03K 17/0812* (2006.01)
  *H03K 17/10* (2006.01)
  *H03K 17/12* (2006.01)
  *H03K 17/14* (2006.01)
  *H03K 17/16* (2006.01)
  *H03K 17/28* (2006.01)

(52) U.S. Cl.
  CPC ..... *H03K 17/08122* (2013.01); *H03K 17/102* (2013.01); *H03K 17/122* (2013.01); *H03K 17/145* (2013.01); *H03K 17/162* (2013.01); *H03K 17/28* (2013.01); *H03K 17/693* (2013.01); *H03K 19/0175* (2013.01)

(56) References Cited

U.S. PATENT DOCUMENTS

| | | | |
|---|---|---|---|
| 7,145,928 B1* | 12/2006 | Maxim | G02F 1/0123 372/38.02 |
| 7,501,670 B2 | 3/2009 | Murphy | |
| 7,719,055 B1 | 5/2010 | McNutt et al. | |
| 7,777,553 B2 | 8/2010 | Friedrichs | |
| 8,208,869 B2 | 6/2012 | Jeong et al. | |
| 8,212,536 B2 | 7/2012 | Burns et al. | |
| 8,446,173 B1* | 5/2013 | Faucher | H03K 19/00361 326/27 |
| 9,325,310 B2* | 4/2016 | Chen | H03K 17/687 |
| 9,519,304 B1* | 12/2016 | Far | G05F 3/262 |
| 9,653,449 B2* | 5/2017 | Ikeda | H01L 27/0255 |
| 9,917,574 B2* | 3/2018 | Cai | H03K 17/04106 |
| 9,921,600 B1* | 3/2018 | Far | G05F 3/262 |
| 9,960,153 B2* | 5/2018 | Akiyama | H01L 21/8213 |
| 10,003,312 B2* | 6/2018 | Dhanasekaran | H03F 3/183 |
| 10,050,621 B2* | 8/2018 | Chern | H03K 17/6877 |
| 2002/0066850 A1* | 6/2002 | Wu | H04B 10/6911 250/214 A |
| 2002/0109525 A1* | 8/2002 | Shin | H03K 19/00384 326/26 |
| 2003/0222701 A1* | 12/2003 | Yang | H03K 3/356113 327/333 |
| 2004/0169549 A1* | 9/2004 | Liu | G05F 3/30 327/539 |
| 2005/0024140 A1* | 2/2005 | Humphrey | H03F 3/34 330/252 |
| 2005/0088163 A1* | 4/2005 | Tachibana | G05F 3/30 323/313 |
| 2008/0186101 A1* | 8/2008 | Arakali | G05F 3/262 330/296 |
| 2009/0278513 A1* | 11/2009 | Bahramian | H01L 21/8258 323/217 |
| 2010/0019806 A1* | 1/2010 | Bien | G05F 3/262 327/108 |
| 2010/0026386 A1* | 2/2010 | Botker | H03F 1/26 330/9 |
| 2010/0156536 A1* | 6/2010 | Lee | H03F 1/0261 330/261 |
| 2010/0225384 A1* | 9/2010 | Hirose | G05F 3/242 327/543 |
| 2010/0259303 A1* | 10/2010 | Liao | G05F 1/56 327/108 |
| 2010/0264974 A1* | 10/2010 | Rien | H03K 19/00315 327/313 |
| 2011/0316632 A1* | 12/2011 | Takemoto | H03F 1/223 330/277 |
| 2012/0044022 A1* | 2/2012 | Walker | H03F 1/0261 330/296 |
| 2012/0262220 A1 | 10/2012 | Springett | |
| 2013/0076322 A1* | 3/2013 | Tateno | H02M 1/38 323/271 |
| 2013/0141168 A1* | 6/2013 | Nozaki | H03F 1/0261 330/296 |
| 2013/0217341 A1* | 8/2013 | Jones | H04B 1/0458 455/73 |
| 2013/0335134 A1* | 12/2013 | Kanazawa | H01L 27/0883 327/404 |
| 2014/0027785 A1* | 1/2014 | Rose | H03K 17/08122 257/77 |
| 2014/0145208 A1* | 5/2014 | Rose | H03K 17/567 257/77 |
| 2014/0152390 A1* | 6/2014 | McMorrow | H03F 1/0261 330/295 |
| 2014/0225163 A1* | 8/2014 | Briere | H01L 27/0248 257/195 |
| 2014/0227983 A1* | 8/2014 | Clausen | H03K 17/063 455/78 |
| 2014/0253217 A1* | 9/2014 | Briere | H03K 17/162 327/382 |
| 2015/0014784 A1* | 1/2015 | Yang | H01L 27/0883 257/379 |
| 2015/0016169 A1* | 1/2015 | Honea | H02M 7/5387 363/132 |
| 2015/0035586 A1* | 2/2015 | Weis | H03K 17/687 327/436 |
| 2015/0109033 A1* | 4/2015 | Zajc | H03K 19/017 327/133 |
| 2015/0162832 A1* | 6/2015 | Briere | H01L 27/0255 323/271 |
| 2015/0270255 A1* | 9/2015 | Ikeda | H01L 27/0255 257/77 |
| 2015/0311895 A1* | 10/2015 | Ali | H03K 19/017509 327/319 |
| 2016/0181788 A1* | 6/2016 | Li | H03K 17/0828 361/79 |
| 2016/0247792 A1 | 8/2016 | Chang | |
| 2016/0308528 A1* | 10/2016 | Yang | H03K 17/162 |
| 2017/0025407 A1* | 1/2017 | Liu | H01L 27/0629 |
| 2017/0093389 A1* | 3/2017 | Kihara | H03K 3/014 |
| 2017/0359060 A1* | 12/2017 | Godycki | H03F 3/2171 |
| 2018/0019721 A1* | 1/2018 | Sharma | H03H 7/03 |
| 2018/0076808 A1* | 3/2018 | Singer | H03K 17/005 |
| 2018/0145684 A1* | 5/2018 | Chang | H03K 17/08122 |

* cited by examiner a source terminal in cascode form. The level sifter may change a voltage level of a switching control signal applied to a gate terminal and provide the changed switching control signal to a gate of the first transistor. The buffer may delay the switching control signal and provide the delayed switching control signal to a gate of the second transistor. The first resistor may be connected between the level shifter and the gate of the first transistor.
CASCODE SWITCH CIRCUIT INCLUDING LEVEL SHIFTER

CROSS-REFERENCE TO RELATED APPLICATIONS

This U.S. non-provisional patent application claims priority under 35 U.S.C. § 119 of Korean Patent Application Nos. 10-2016-0156016, filed on Nov. 22, 2016, and 10-2017-0021266, filed on Feb. 16, 2017, the entire contents of which are hereby incorporated by reference.

BACKGROUND

The present disclosure herein relates to a cascode switch circuit, and more particularly, to a cascode switch circuit including a level shifter.

A switch circuit used in a power electronic system requires a high breakdown voltage, a normally off characteristic, low on resistance, a high current characteristic, and a high speed switching characteristic. For this, researches are being performed on a switch circuit in which a transistor having a low breakdown voltage and a normally off characteristic, and a transistor having a high breakdown voltage and a normally on characteristic are combined.

A switch circuit may include a plurality of transistors connected in cascode form. In such a switch circuit, when operating times of transistors are different, a ripple may be generated in the switch circuit. Such a switch circuit may be difficult to operate at high speed. In addition, A current amount flowing through the switch circuit may be limited due to a voltage constraint between the gate and source of the transistor having a normally on characteristic. When the current amount is limited, there is a limitation in a high power operation of the switch circuit.

SUMMARY

The present disclosure provides a cascode switch circuit including a level shifter.

An embodiment of the inventive concept provides a cascode circuit may include first and second transistors, a level shifter, a buffer, and a first resistor. The first and second transistors may be connected between a drain terminal and

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, an exemplary embodiment of the present disclosure will be described in detail with reference to the accompanying drawings such that a person skilled in the art may easily carry out the embodiments of the present disclosure.

Figure 1:
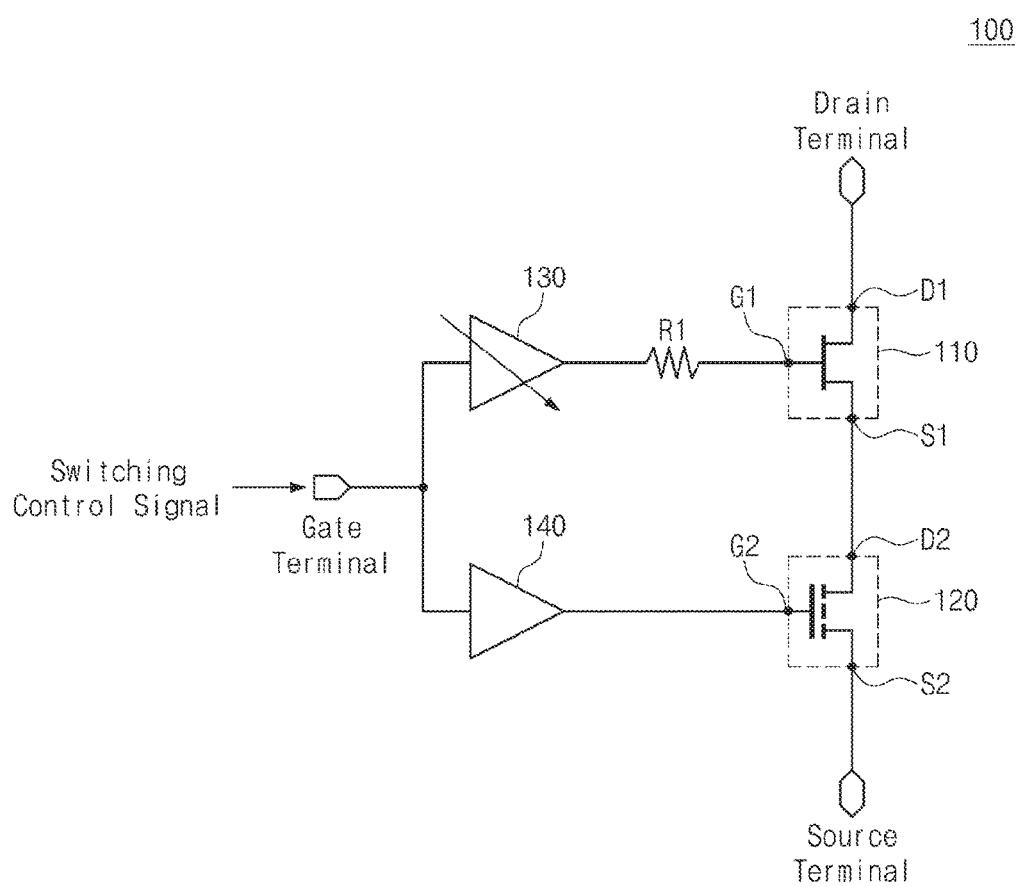
FIG. 1 is an exemplary block diagram showing a cascode switch circuit according to an embodiment of the present inventive concept.

FIG. 1 is an exemplary block diagram showing a cascode switch circuit according to an embodiment of the present inventive concept. Referring to FIG. 1, a cascode switch circuit 100 may include a first transistor 110, a second transistor 120, a level shifter 130, a buffer 140 and a first resistor R1.

The cascode switch circuit 100 may connect or disconnect a drain terminal to or from a source terminal according to a voltage applied to a gate terminal. For example, when a high voltage is applied to the gate terminal, the drain terminal and the source terminal may be connected to each other. In other words, the cascode switch circuit 100 may be turned on. When a low voltage is applied to the gate terminal, the drain terminal and the source terminal may be disconnected from each other. In other words, the cascode switch circuit 100 may be turned off. Here, the high voltage is higher than a threshold voltage and a low voltage is lower than the threshold voltage. The threshold voltage may be determined by characteristics of transistors included in the cascode switch circuit 100.

The first transistor 110 may include a gate G1, a drain D1 and a source S1. The first transistor 110 may have a high breakdown voltage and a normally on characteristic. Similarly, a second transistor 120 may include a gate G2, a drain D2, and a source S2. However, unlike the first transistor 110, the second transistor 120 may have a low breakdown voltage and a normally off characteristic.

In an embodiment, the first transistor 110 may be a field effect transistor (FET) including Gallium Nitride (GaN), or Silicon Carbide (SiC), etc. The second transistor 120 may be an FET including silicon (Si). For example, the second transistor 120 may be a metal-oxide semiconductor (MOS) FET.

The first transistor 110 and the second transistor 120 may be connected in cascode form. Through this, the switch circuit 100 may include both of the high breakdown voltage characteristic of the first transistor 110 and the normally off characteristic of the second transistor 120. In more detail, the source S1 of the first transistor 110 and the drain D2 of the second transistor 120 may be connected to each other. The drain D1 of the first transistor 110 may be connected to the drain terminal. The source S2 of the second transistor 120 may be connected to the source terminal.

Referring to FIG. 1, the gate G1 of the first transistor 110 and the gate G2 of the second transistor 120 are not directly connected to each other. The level shifter 130 and the first resistor R1 may be disposed between the gate terminal and the gate G1 of the first transistor 110. A buffer 140 may be disposed between the gate terminal and the gate G2 of the second transistor G2. A switching control signal applied to the gate terminal may be applied to the gate G1 of the first transistor 110 via the level shifter 130 and the first resistor R1. The switching control signal applied to the gate terminal may be applied to the gate G2 of the second transistor 120 via the buffer 140. Here, the switching control signal indicates a signal applied to the gate terminal for controlling turn-on or turn-off of the cascode switch circuit 100.

The level shifter 130 may change a voltage level of the switching control signal applied to the gate terminal. In more detail, the level shifter 130 may lower the voltage level of the switching control signal. The level shifter 130 may provide the changed switching control signal to the gate G1 of the first transistor 110. Since the voltage level of the signal applied to the gate G1 of the first transistor 110 is lowered by the level shifter 130, reliability of the first transistor 110 may be enhanced. In order to explain the above-described effect in more detail, a case is assumed where the switch circuit 100 does not include the level shifter 130.

When the switch circuit 100 does not include the level shifter 130, the gate G1 of the first transistor 110 and the gate G2 of the second transistor 120 may be directly connected. When a high voltage is applied to the gate G2 of the second transistor for turning on the second transistor 120, the high voltage may also be applied to the gate G1 of the first transistor at the same time. For example the high voltage may be 6 V to 10 V. Due to the applied high voltage, the gate G1 of the first transistor may come to a rupture or collapse. In particular, when the high voltage and low voltage are repetitively rapidly applied, the gate G1 of the first transistor may come to a rupture or collapse more easily. Here, the low voltage may indicate a voltage for turning off the second transistor 120. For example, the low voltage may be about 0 V. When the switch circuit 100 includes the level shifter 130, a voltage applied to the gate G1 of the first transistor 110 may be further lowered than a case without the level shifter 130. Accordingly, the level shifter 130 may enhance reliability of the first transistor 110.

The level shifter 130 may set a voltage $V_{GS1}$ between the gate and source of the first transistor 110 for increasing the current of the first transistor 110. Typically, a current in a transistor, namely, a current flowing from a drain to a source may be determined by a voltage between a gate and the source, and a voltage between the drain and the source. As the voltage between the gate and the source is larger, the current of the transistor may increase. According to an embodiment of the present inventive concept, for increasing the current of the first transistor 110, the level shifter 130 may set the voltage level of the changed switching control signal to be equal to or greater than about 0 V.

In other words, for enhancing reliability of the gate G1 of the first transistor 110, the level shifter 130 may lower the voltage level of the switching control signal. However, for increasing the current of the transistor 110, the level shifter 130 may set the level of voltage $V_{GS1}$ between the gate and source of the first transistor 110 to be equal to or greater than about 0 V.

The buffer 140 may delay the switching control signal. In an embodiment, a delay time by the buffer 140 may coincide with a delay time by the level shifter 130. As the level shifter 130 changes the voltage level of the switching control signal, the buffer 140 may delay the switching control signal by a changing time (or the delay time) of the level shifter 130. In another embodiment, the buffer 140 may delay the switching control signal by a sum of the changing time of the level shifter 130 and a delay time by the first resistor R1, which will be described later. In other words, the buffer 140 may perform adjustment such that a time taken by the switching control signal to reach the gate G1 of the first transistor 110 coincides with a time taken by the switching control signal to reach the gate G2 of the second transistor 120.

When the cascode switch circuit 100 does not include the buffer 140, an operation time of the first transistor 110 and an operation time of the second transistor 120 may be different from each other. Here, the operation time indicates a turn-on time or a turn-off time of the transistor. Due to the difference between the operation times, a ripple may be generated in an output result of the cascode switch circuit 100 (e.g. a voltage $V_{DS}$ between the drain terminal and the source terminal or a current $I_{DS}$ flowing from the drain terminal to the source terminal).

According to an embodiment of the present inventive concept, the switching control signal may reach the gate G1 of the first transistor 110 and the gate G2 of the second transistor 120 at the same time. Accordingly, the first and second transistors 110 and 120 may be turned on or turned off at the same time. Accordingly, the ripple may be reduced or removed.

The first resistor R1 may be disposed between the level shifter 130 and the gate G1 of the first transistor 110. In more detail, one end of the first resistor R1 may be connected to an output of the level shifter 130 and the other end of the first resistor R1 may be connected to the gate G1 of the first transistor 110. As described above, the first transistor 110 may have the high breakdown voltage and the normally on characteristic, and the second transistor 120 may have the low breakdown voltage and the normally off characteristic. Accordingly, a switching transition time of the first transistor 110 may be shorter than that of the second transistor 120. Here, the switching transition time indicates a rising time and a falling time of a signal passing from the drain and the source. The first resistor R1 may allow the switching transition time of the first transistor 110 and the switching transition time of the second transistor 120 to coincide with each other. For this, the first resistor R1 may delay the rising time or falling time of the switching control signal applied to the gate G1 of the first transistor 110.

A time constant of the switching control signal applied to the gate G1 of the first transistor 110 may be determined by the magnitude of the first resistor R1, capacitance of the gate G1 of the first transistor 110, or capacitance of the output of the level shifter 130, etc. As the magnitude of the first resistor R1 increases, the time constant may increase. According to an embodiment of the present inventive concept, the time constant of the switching control signal applied to the gate G1 of the first transistor 110 may be set such that the switching transition time of the first transistor 110 and the switching transition time of the second transistor 120 coincide with each other. Accordingly, the magnitude of the first resistor R1 may be set to achieve the foregoing time constant.

According to an embodiment to the present inventive concept, the operation time of the first transistor 110 and the operation time of the second transistor 120 may coincide with each other by the buffer 140, and the switching transition time of the first transistor 110 and the switching transition time of the second transistor 120 may coincide with each other by the first resistor R1. Accordingly, the cascode switch circuit 100 may improve a ripple that may be generated at the time of switching.

In an embodiment, the cascode switch circuit 100 may be manufactured in one package. In this case, the gate terminal, drain terminal, and source terminal may be respectively connected to pins or balls of the package or may be respectively connected to pins or balls of the package through a driver (not illustrated). For example, the package including the cascode switch circuit 100 may be electrically connected to a printed circuit board (PCB) through the pins or balls.

Figure 2:
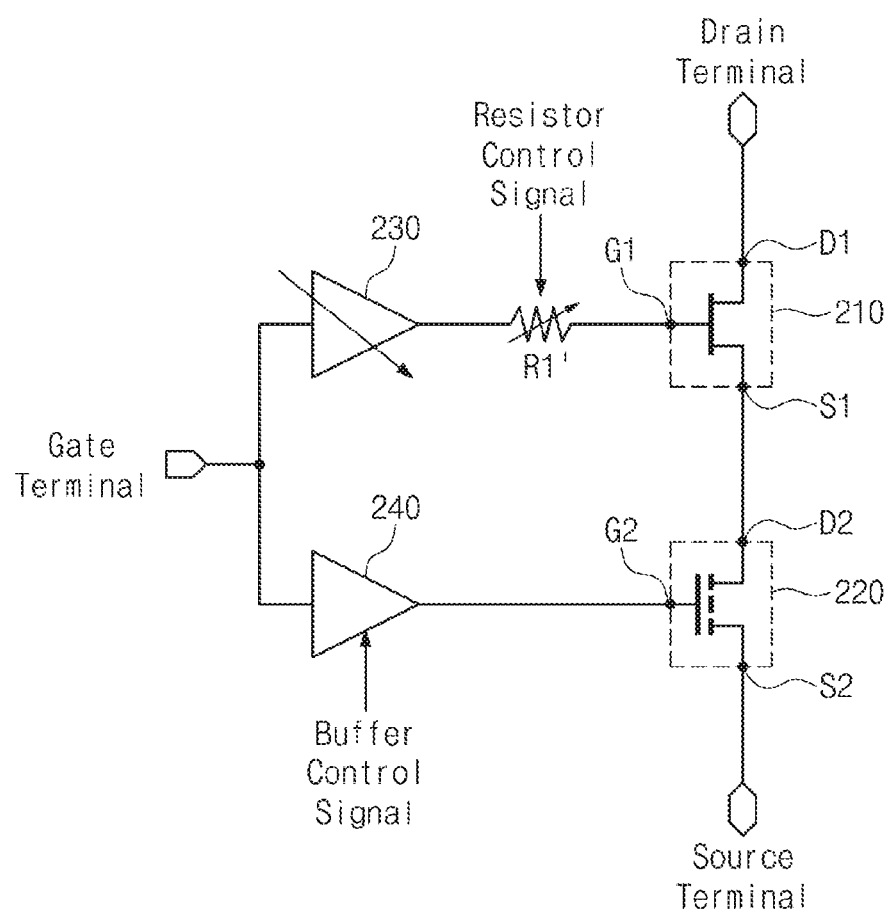
FIG. 2 is an exemplary block diagram showing a cascode switch circuit according to an embodiment of the present inventive concept.

FIG. 2 is an exemplary block diagram showing a cascode switch circuit according to an embodiment of the present inventive concept. Referring to FIG. 2, a cascode switch circuit 200 may include a first transistor 210, a second transistor 220, a level shifter 230, a buffer 240 and a first resistor R1'. The first transistor 210, the second transistor 220, the level shifter 230, the buffer 240 and the first resistor R1' are substantially similar to those described in relation to FIG. 1. Hereinafter, descriptions will be mainly provided about the difference between the cascode switch circuit 100 of FIG. 1 and the cascode switch circuit 200 of FIG. 2.

Comparing the buffer 140 of FIG. 1 with the buffer 240 of FIG. 2, the buffer 240 may receive a buffer control signal. The buffer 240 may adjust a delay time according to the buffer control signal. In an embodiment, the buffer 240 may receive the buffer control signal through another terminal except a gate terminal, a drain terminal, or a source terminal. In an embodiment, the buffer control signal may be an analog signal or a digital signal. Even when there is a change in delay time of the level shifter 230 according to PVT (process, voltage, temperature) variations, the buffer 240 may delay the switching control signal by the delay time of the level shifter 230.

Comparing the first resistor R1 of FIG. 1 with the first resistor R1' of FIG. 2, the first resistor R1' of FIG. 2 may be a variable resistor and may receive a resistor control signal. Similarly to the buffer controls signal, the resistor control signal may be received through another terminal except the gate terminal, the drain terminal, and the source terminal. The first resistor R1' may adjust the magnitude of the resistor in response to the resistor control signal. In an embodiment, the resistor control signal may be an analog signal or a digital signal. The magnitude of the first resistor R1' may be set to allow a switching transition time of the first transistor 210 and a switching transition time of the second transistor 220 to coincide with each other.

Figure 3:
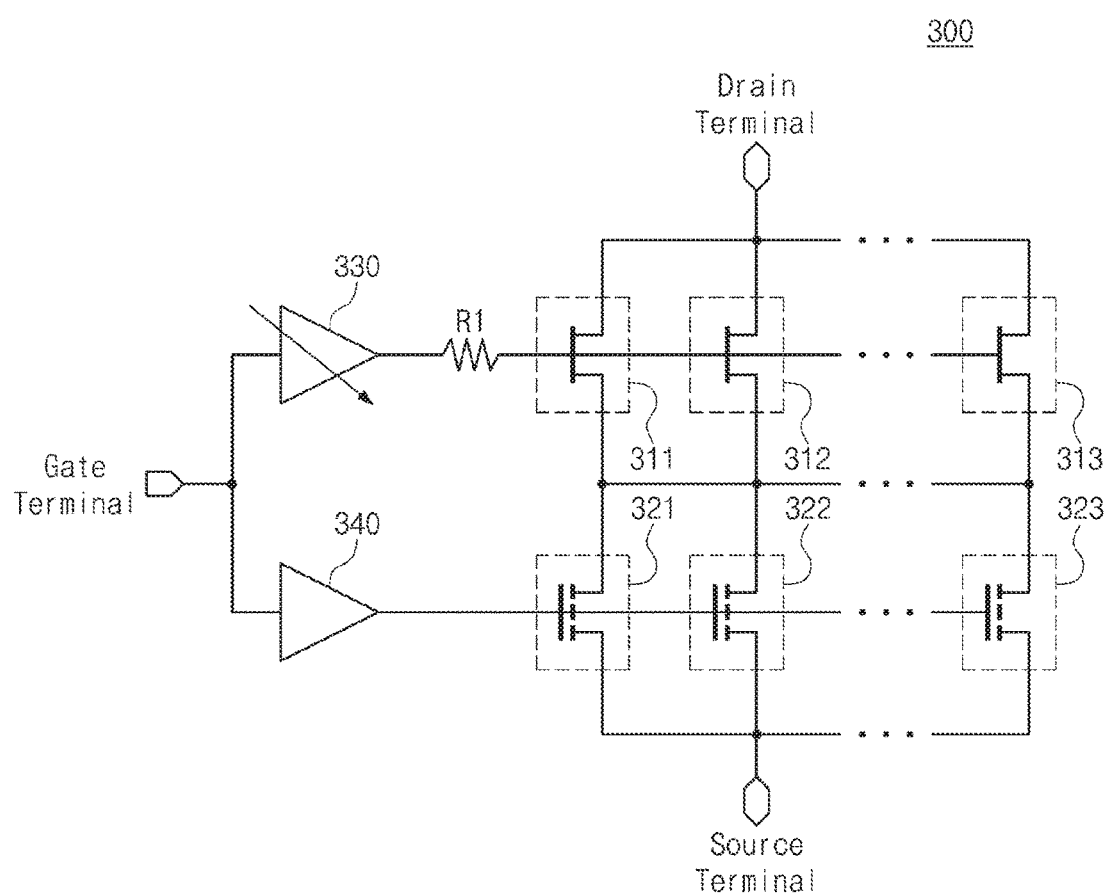
FIG. 3 is an exemplary block diagram showing a cascode switch circuit according to an embodiment of the present inventive concept.

FIG. 3 is an exemplary block diagram showing a cascode switch circuit according to an embodiment of the present inventive concept. Referring to FIG. 3, a cascode switch circuit 300 may include first transistors 311 to 313, second transistors 321 to 323, a level shifter 330, a buffer 340 and a first resistor R1. The first transistor 311, the second transistor 321, the level shifter 330, the buffer 340 and the first resistor R1 are substantially similar to those described in relation to FIG. 1. Hereinafter, descriptions will be mainly provided about the difference between the cascode switch circuit 100 of FIG. 1 and the cascode switch circuit 300 of FIG. 3.

The first transistors 311 to 313 may be connected in parallel. Here, the number of the first transistors 311 to 313 is not limited to the illustrated. In more detail, all gates of the first transistors 311 to 313 may be connected to the first resistor R1. All drains of the first transistors 311 to 313 may be connected to a drain terminal. All sources of the first transistors 311 to 313 may be connected to each other.

The second transistors 321 to 323 may be connected in parallel. Here, the number of the second transistors 321 to 323 is not limited to the illustrated. The number of the second transistors 321 to 323 may be identical to or different from the number of the first transistors 311 to 313. In more detail, all gates of the second transistors 321 to 323 may be connected to the buffer 340. All sources of the second transistors 321 to 323 may be connected to the source terminal. All drains of the second transistors 321 to 323 may be connected to each other. In addition, all the drains of the second transistors 321 to 323 and all the sources of the first transistors 311 to 313 may be connected to each other. In other words, the cascode switch circuit 300 may further include wirings for connecting all the drains of the second transistors 321 to 323 to the all the sources of the first transistors 311 to 313.

Unlike the cascode circuit 100 of FIG. 1, the cascode switch circuit 300 of FIG. 3 may further include the first transistors 312 to 313 and the second transistors 322 to 323. In an embodiment, the first transistors 311 to 313 may be identical to each other and the second transistors 321 to 323 may be identical to each other. When the number of the first transistors 312 to 313 and the number of the second transistor 322 to 323 increase, a current that may flow from the drain terminal to the source terminal may increase. In other words, the current (i.e. the current flowing from the drain terminal to the source terminal) of the cascode switch circuit 300 may be larger than that of the cascode switch circuit 100.

Figure 4:
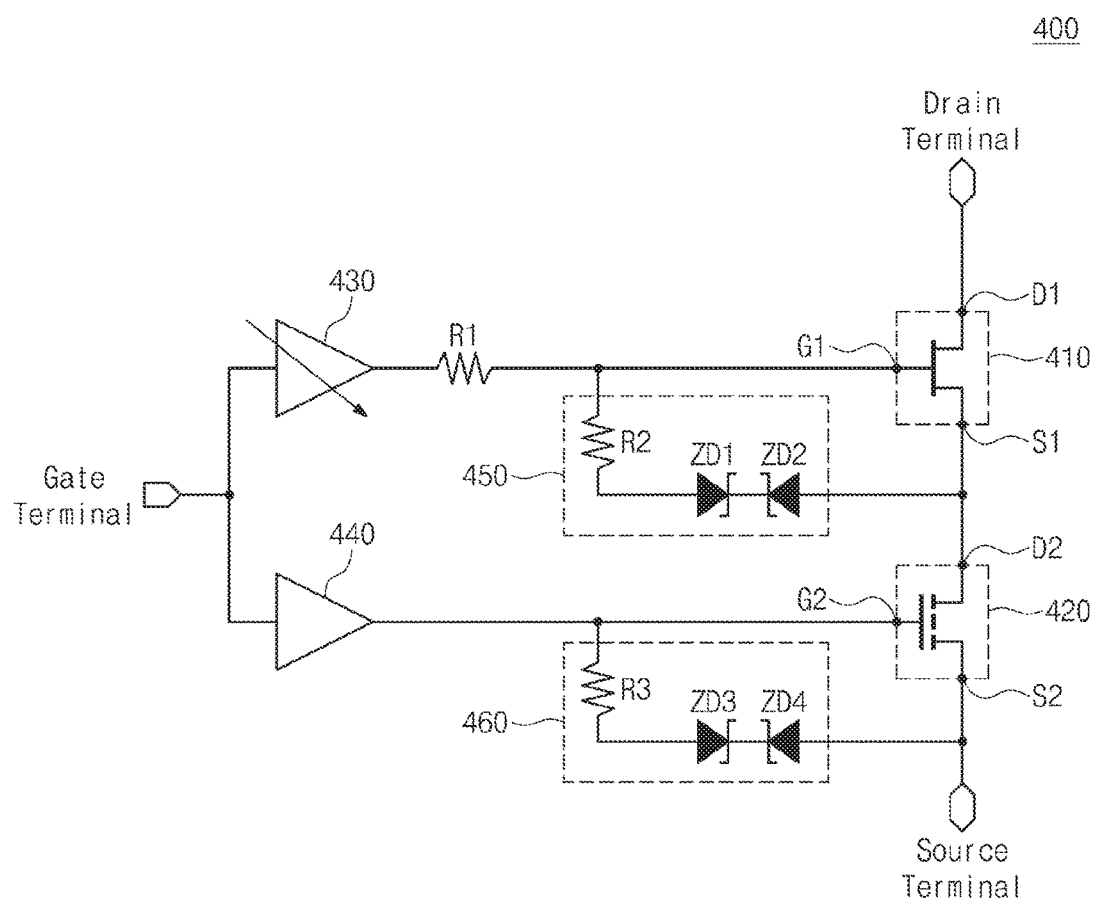
FIG. 4 is an exemplary block diagram showing a cascode switch circuit according to an embodiment of the present inventive concept.

FIG. 4 is an exemplary block diagram showing a cascode switch circuit according to an embodiment of the present inventive concept. Referring to FIG. 4, a cascode switch circuit 400 may include a first transistor 410, a second transistor 420, a level shifter 430, a buffer 440, a first resistor R1, a first clamp circuit 450, and a second clamp circuit 460. The first transistor 410, the second transistor 420, the level shifter 430, the buffer 440 and the first resistor R1 are substantially similar to those described in relation to FIG. 1. Hereinafter, descriptions will be mainly provided about the difference between the cascode switch circuit 100 of FIG. 1 and the cascode switch circuit 400 of FIG. 4.

Unlike the cascode circuit 100 of FIG. 1, the cascode switch circuit 400 of FIG. 4 may further include the first clamp circuit 450 and the second clamp circuit 460.

The first clamp circuit 450 may include a second resistor R2, a first zener diode ZD1 and a second zener diode ZD2. One end of the second resistor R2 may be connected to the first resistor R1 and a gate G1 of the first transistor 410. The other end of the second resistor R2 may be connected to an anode of the first zener diode ZD1. A cathode of the first zener diode ZD1 and a cathode of the second zener diode ZD2 may be connected to each other. An anode of the second zener diode may be connected to a source Si of the first transistor 410.

The second clamp circuit 460 may include a third resistor R3, a third zener diode ZD3 and a fourth zener diode ZD4.

One end of the third resistor R3 may be connected to the buffer 440 and a gate G2 of the second transistor 420. The other end of the third resistor R3 may be connected to an anode of the third zener diode ZD3. A cathode of the third zener diode ZD3 and a cathode of the fourth zener diode ZD4 may be connected to each other. An anode of the fourth zener diode ZD4 may be connected to a source S2 of the second transistor 420.

The second resistor R2 may limit a current flowing through the first zener diode ZD1 and the second zener diode ZD2. Similarly, the third resistor R3 may limit a current flowing through the third zener diode ZD3 and the fourth zener diode ZD4. The second and third resistors R2 and R3 may prevent the first to fourth zener diodes ZD1 to ZD4 from being ruptured due to overcurrent. The first zener diode ZD1 and the second zener diode ZD2 may limit, an absolute value of a voltage $V_{GS1}$ between the gate and source of the first transistor 410 to a zener voltage or less. Similarly, the third zener diode ZD3 and the fourth zener diode ZD4 may limit an absolute value of a voltage $V_{GS2}$ between the gate and source of the second transistor 420 to a zener voltage or less.

In other words, the first clamp circuit 450 may limit the level of the voltage $V_{GS1}$ between the gate and source of the first transistor 410. Similarly, the second clamp circuit 460 may limit the level of the voltage $V_{GS2}$ between the gate and source of the second transistor 420. Accordingly, the first and second clamp circuits 450 and 460 may protect the first and second transistors 410 and 420 from overvoltage or overcurrent that may be applied through the gate terminal, the drain terminal, or the source terminal. In addition, the first and second clamp circuits 450 and 460 may protect the first and second transistors 410 and 420 from a surge voltage or a surge current.

Figure 5:
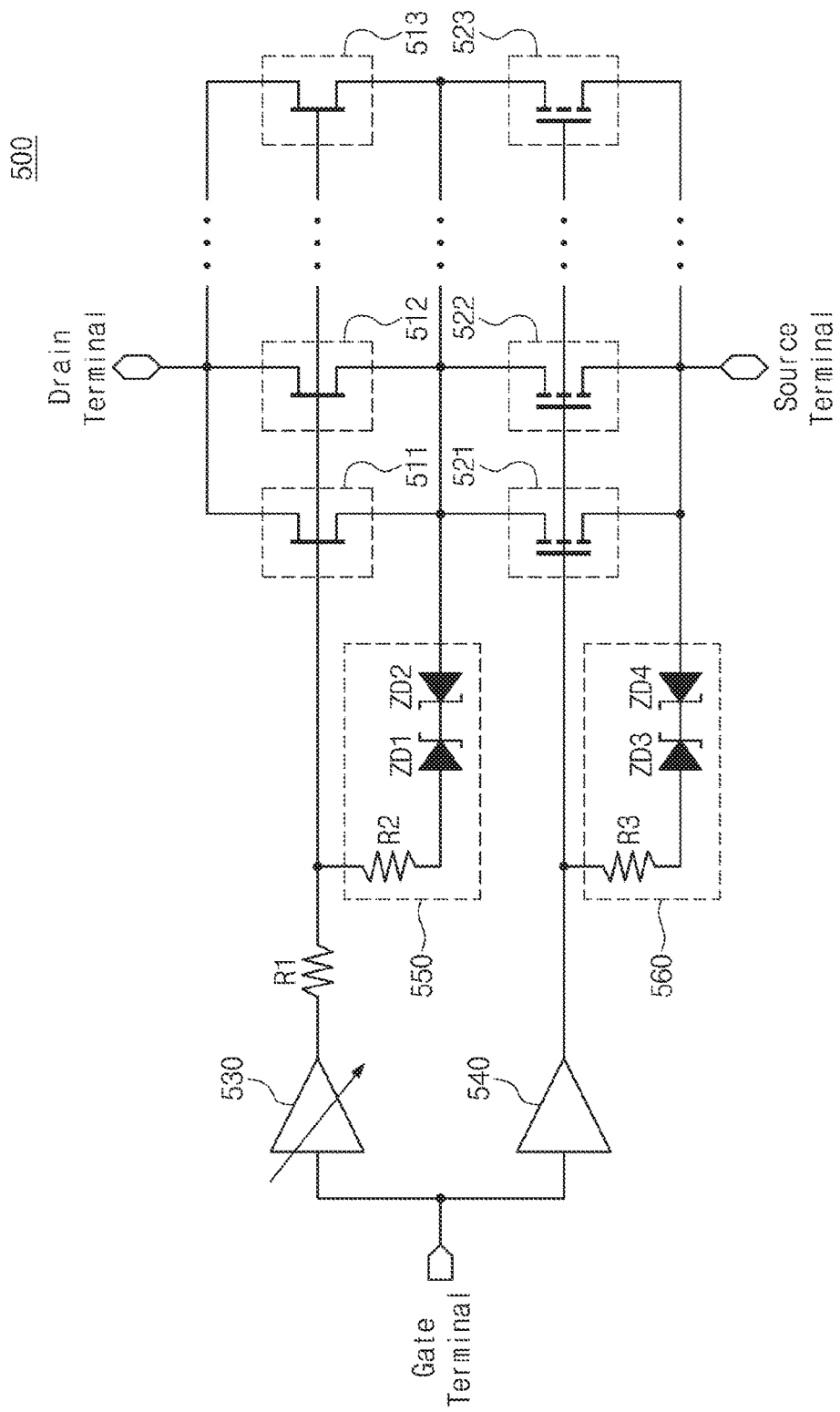
FIG. 5 is an exemplary block diagram showing a cascode switch circuit according to an embodiment of the present inventive concept.

FIG. 5 is an exemplary block diagram showing a cascode switch circuit according to an embodiment of the present inventive concept. Referring to FIG. 5, a cascode switch circuit 500 may include first transistors 511 to 513, second transistors 521 to 523, a level shifter 530, a buffer 540, a first resistor R1, a first clamp circuit 550, and a second clamp circuit 560. The first transistors 511 to 513, the second transistors 521 to 523, the level shifter 530, the buffer 540, the first resistor R1, the first clamp circuit 550, and the second clamp circuit 560 are substantially similar to those of FIGS. 1 to 4. In addition, second and third resistors R2 and R3 of the first and second clamp circuits 550 and 560, and the first to fourth zener diodes ZD1 to ZD4 may be substantially similar to those of FIG. 4. Hereinafter, descriptions will be mainly provided about the difference between the cascode switch circuit 400 of FIG. 4 and the cascode switch circuit 500 of FIG. 5.

Unlike the first clamp circuit 450 of FIG. 4, the first clamp circuit 550 may limit voltage levels between gates and sources of the first transistors 511 to 513. Similarly, the second clamp circuit 560 may limit voltage levels between the gates and sources of the second transistors 521 to 523. In other words, the first transistors 511 to 513 may share the first clamp circuit 550 and the second transistors 521 to 523 may share the second clamp circuit 560.

Figure 6:
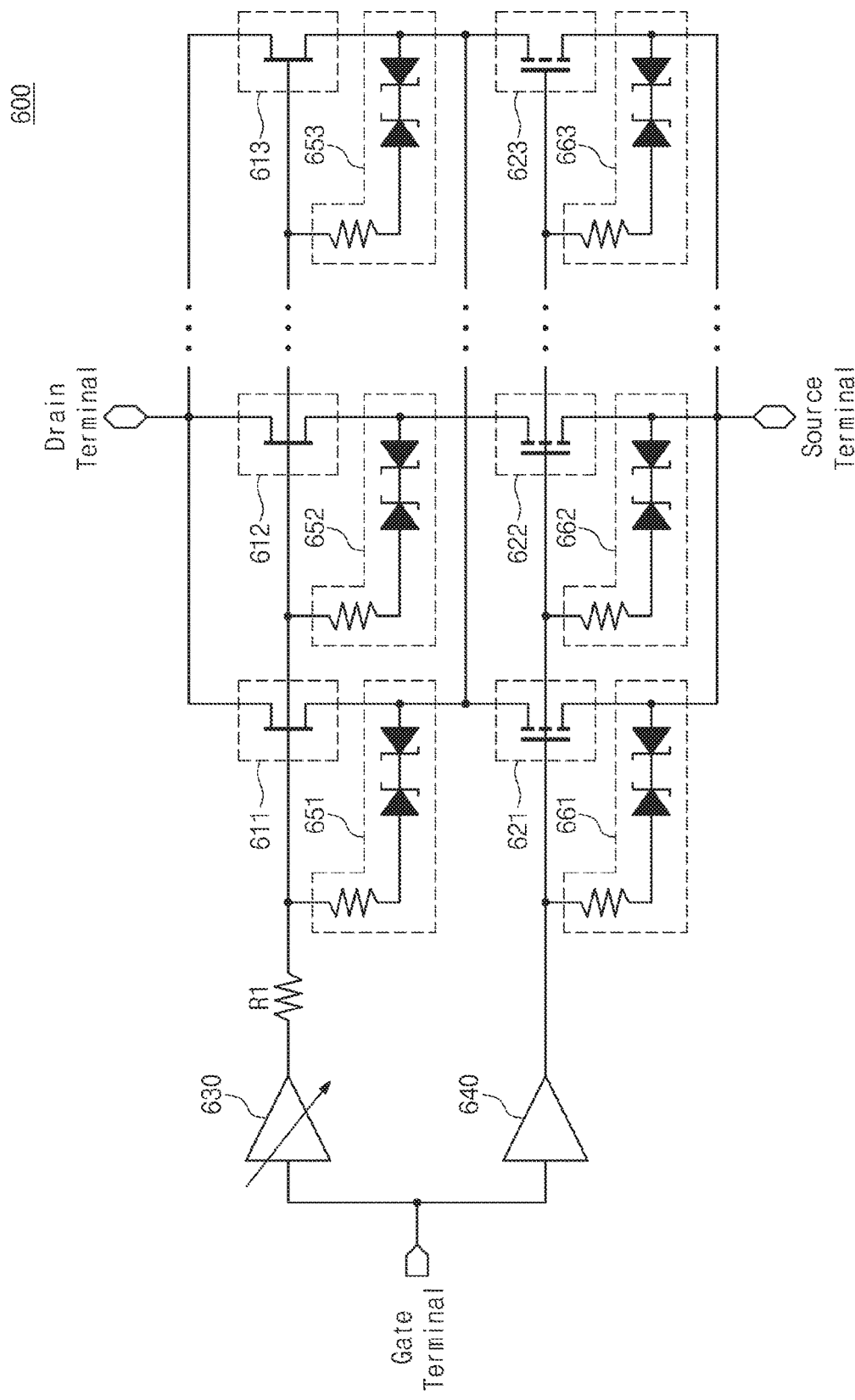
FIG. 6 is an exemplary block diagram showing a cascode switch circuit according to an embodiment of the present inventive concept.

FIG. 6 is an exemplary block diagram showing a cascode switch circuit according to an embodiment of the present inventive concept. Referring to FIG. 6, a cascode switch circuit 600 may include first transistors 611 to 613, second transistors 621 to 623, a level shifter 630, a buffer 640, a first resistor R1, first clamp circuits 651 to 653, and second clamp circuits 661 to 663. The first transistors 611 to 613, the second transistors 621 to 623, the level shifter 630, the buffer 640, the first resistor R1, the first clamp circuit 651, and the second clamp circuit 661 are substantially similar to those of FIGS. 1 to 5. Hereinafter, descriptions will be mainly provided about the difference between the cascode switch circuit 500 of FIG. 5 and the cascode switch circuit 600 of FIG. 6.

Comparing with the cascode switch circuit 500 described in relation to FIG. 5, the cascode switch circuit 600 may further include the first clamp circuits 652 to 653 and the second clamp circuits 662 to 663. The first clamp circuits 651 to 653 may be identical to each other, and the second clamp circuits 661 to 663 may be identical to each other. The first clamp circuits 651 to 653 may limit voltage levels between the gates and sources of the first transistors 611 to 613. The second clamp circuits 661 to 663 may limit voltage levels between the gates and sources of the second transistors 621 to 623.

Figure 7:
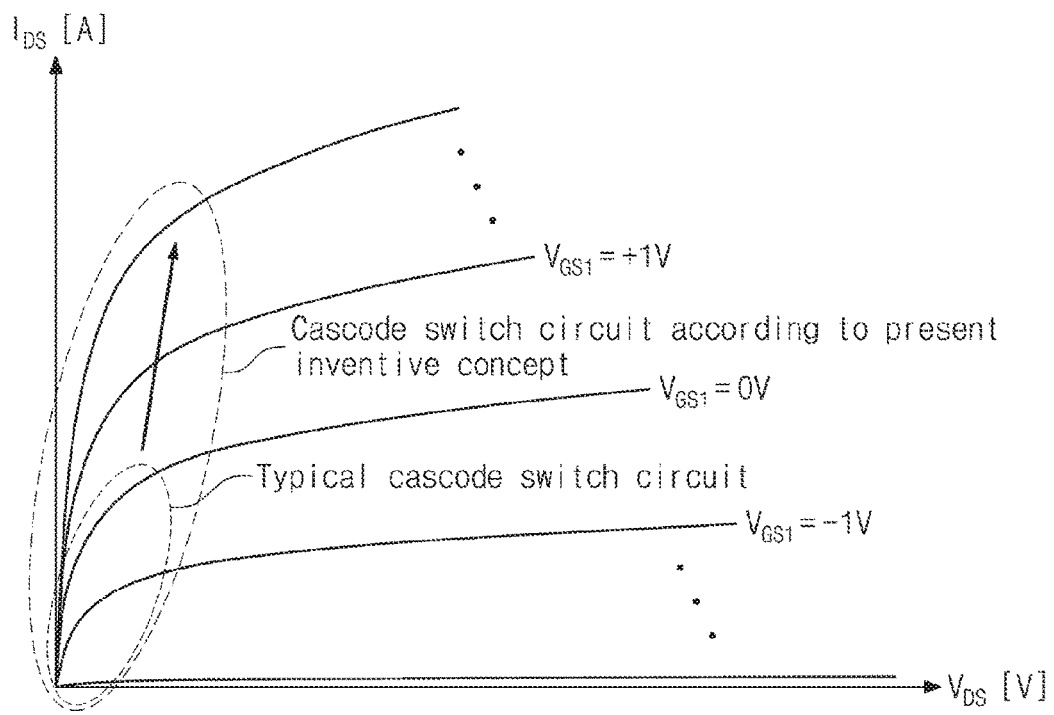
FIG. 7 exemplarily shows voltage-current graphs of a typical cascode switch circuit and a cascode switch circuit according to an embodiment of the present inventive concept.

FIG. 7 exemplarily shows voltage-current graphs of a typical cascode switch circuit and a cascode switch circuit according to an embodiment of the present inventive concept. FIG. 7 will be explained with reference to FIG. 1. In FIG. 7, a horizontal axis indicates a voltage $V_{DS}$ between a drain terminal and a source terminal and a vertical axis indicates a current $I_{DS}$ flowing from the drain terminal to the source terminal.

Referring to FIG. 7, as a voltage $V_{GS1}$ between the gate and source of the first transistor increases (−1 V, 0V, and 1V), $I_{DS}$ may increase. As $I_{DS}$ increases, the cascode switch circuit 100 may operate at high speed. Since a source terminal is connected to a gate of a first transistor in a typical cascode switch circuit, $V_{GS1}$ may not increase to about 0 V or greater. On the contrary, in the cascode switch circuit 100 according to an embodiment of the present inventive concept, $V_{GS1}$ may be set to about 0 V or greater by the level shifter 130. Accordingly, the current $I_{DS}$ of the cascode switch circuit 100 according to an embodiment of the present inventive concept may be greater than the current of the typical cascode switch circuit.

Figure 8:
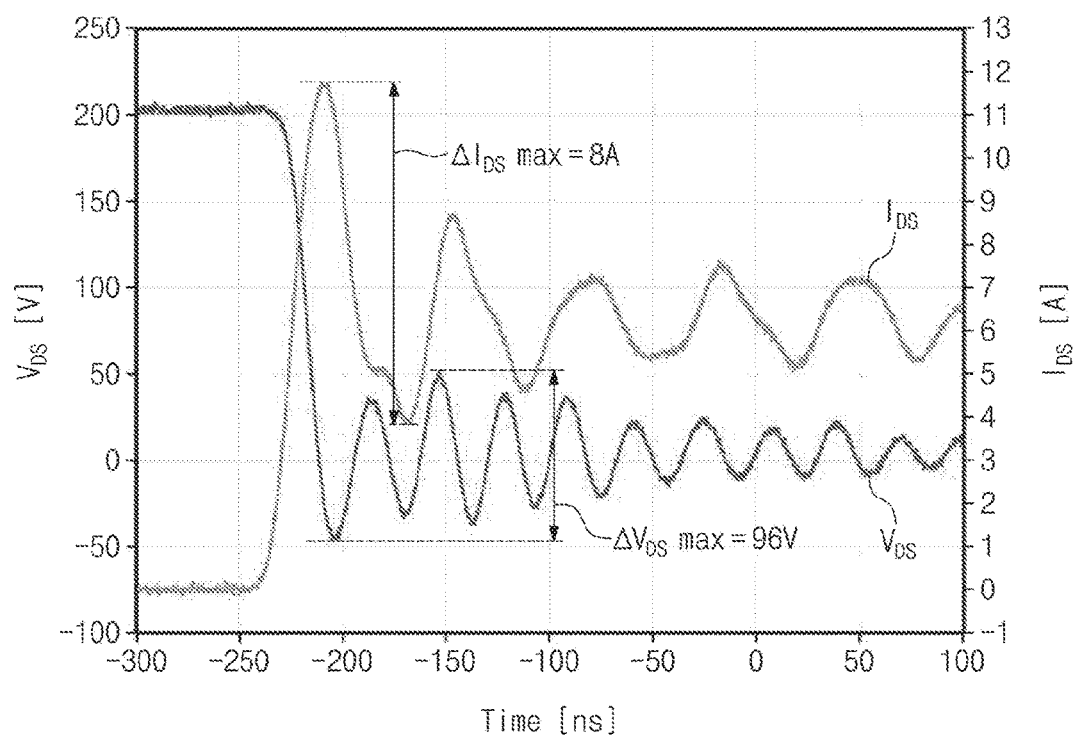
FIG. 8 is a timing diagram exemplarily showing a turn-on operation of a typical cascode switch circuit.
Figure 9:
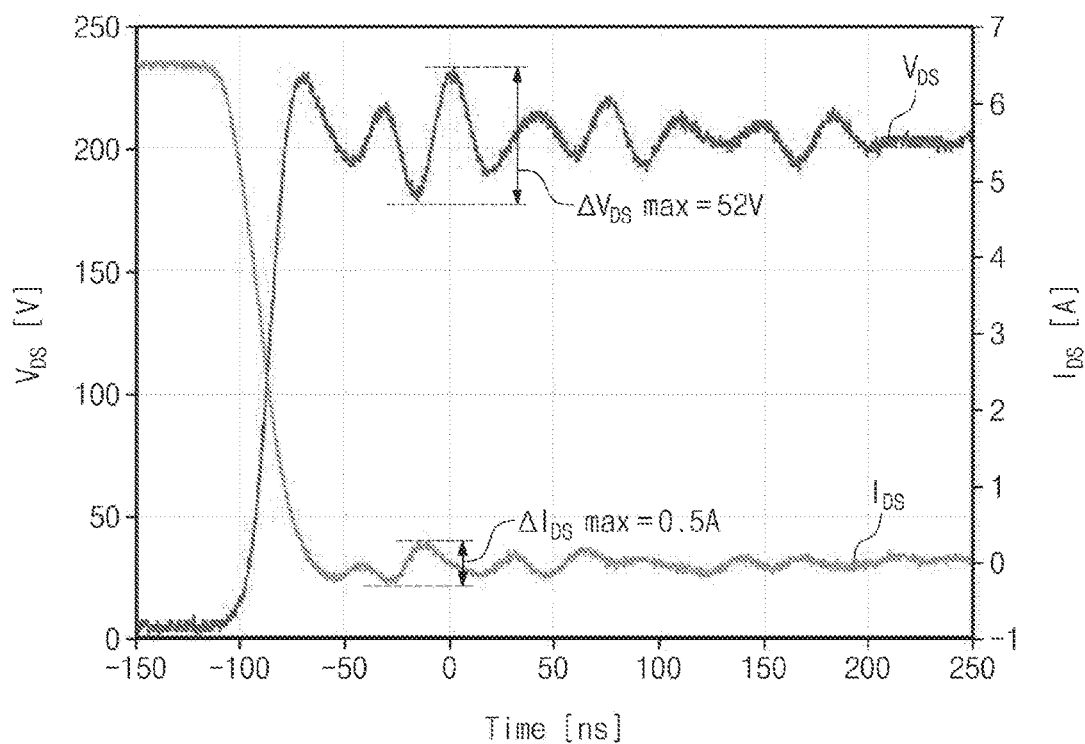
FIG. 9 is a timing diagram exemplarily showing a turn-off operation of a typical cascode switch circuit.
Figure 10:
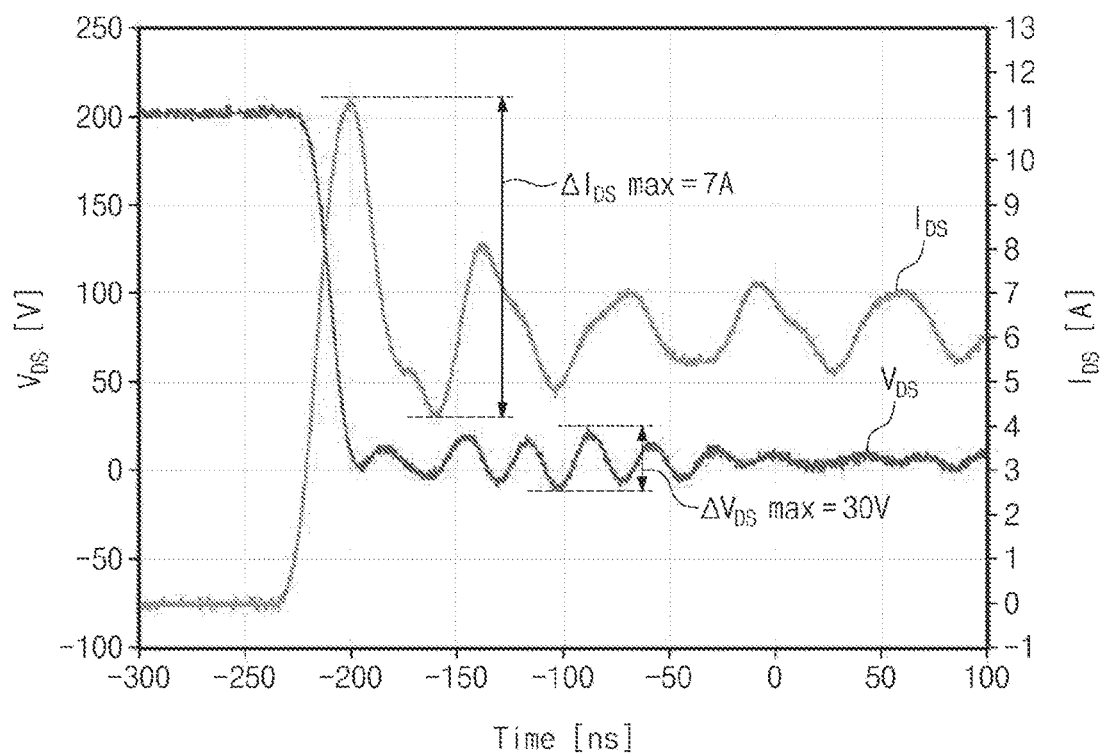
FIG. 10 is a timing diagram exemplarily showing a turn-on operation of a cascode switch circuit according to an embodiment of the present inventive concept.
Figure 11:
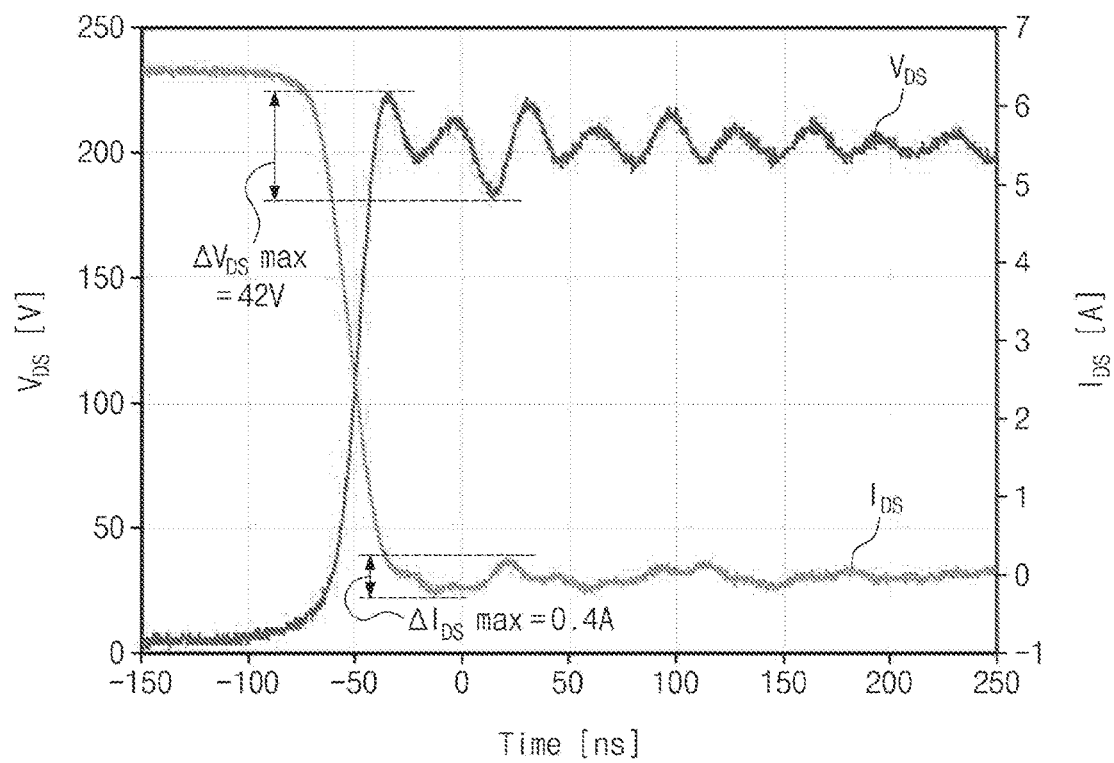
FIG. 11 is a timing diagram exemplarily showing a turn-off operation of a cascode switch circuit according to an embodiment of the present inventive concept.

FIG. 8 is a timing diagram exemplarily showing a turn-on operation of a typical cascode switch circuit. FIG. 9 is a timing diagram exemplarily showing a turn-off operation of a typical cascode switch circuit. FIG. 10 is a timing diagram exemplarily showing a turn-on operation of a cascode switch circuit according to an embodiment of the present inventive concept. FIG. 11 is a timing diagram exemplarily showing a turn-off operation of a cascode switch circuit according to an embodiment of the present inventive concept. In FIGS. 8 to 11, horizontal axises indicate a time and vertical axises indicate the voltage $V_{DS}$ between the drain terminal and source terminal, and the current $I_{DS}$ flowing from the drain terminal to the source terminal. Here, unlike the switch circuit 100 according to an embodiment of the present inventive concept, the typical cascode switch circuit indicates a switch circuit not including the level shifter 130, the buffer 140, and the first resistor R1.

When the cascode switch circuit is turned on, $V_{DS}$ decreases from about 200 V to about 0 V, and the $I_{DS}$ may become about 6 A. On the contrary, when the cascode switch circuit is turned off, $V_{DS}$ increases from about 0 V to about 200 V, and the $I_{DS}$ may become about 0 A.

Comparing FIG. 8 with FIG. 10, a voltage ripple of the typical cascode switch circuit is maximum about 96 V and a current ripple is maximum about 8 A. On the other hand, a voltage ripple of the cascode switch circuit 100 according to an embodiment of the present inventive concept is maximum about 30 V and a current ripple is maximum about 7 A.

Comparing FIG. 9 with FIG. 11, a voltage ripple of the typical cascode switch circuit is maximum about 52 V and a current ripple is maximum about 0.5 A. On the other hand, a voltage ripple of the cascode switch circuit 100 according to an embodiment of the present inventive concept is maximum about 42 V and a current ripple is maximum 0.4 A.

In other words, a cascode switch circuit according to an embodiment of the inventive concept may reduce or remove a voltage ripple or a current ripple generated at the time of switching. Since stresses of the first and second transistors 110 and 120 are reduced due to reduction in voltage ripple or current ripple, reliabilities of the first and second transistors 110 and 120 may be enhanced.

A cascode switch circuit according to an embodiment of the present inventive concept may improve reliability of a transistor using a level shifter.

A cascode switch circuit according to an embodiment of the present inventive concept may operate at high speed by increasing a current flowing from a drain terminal to a source terminal.

A cascode switch circuit according to an embodiment of the inventive concept may reduce or remove a ripple generated at the time of switching. The ripple improvement may enhance reliability of the transistor.

The foregoing description is about detailed examples for practicing the inventive concept. The present disclosure includes not only the above-described embodiments but also simply changed or easily modified embodiments. In addition, the inventive concept may also include technologies obtained by easily modifying and practicing the above-described embodiments.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A cascode switch circuit comprising:
   a normally-on transistor connected to a drain terminal;
   a normally-off transistor connected to a source terminal, the normally-off transistor being connected to the normally-on transistor in cascade form;
   a level shifter configured to change a voltage level of a switching control signal applied to a gate terminal and provide the changed switching control signal to a gate of the normally-on transistor, the level shifter being connected between the gate terminal and a first resistor; and
   a buffer configured to delay the switching control signal and provide the delayed switching control signal to a gate of the normally-off transistor, the buffer being connected between the gate terminal and the gate of the normally-off transistor
   wherein the first resistor is connected between the level shifter and the gate of the normally-on transistor.

2. The cascode switch circuit of claim 1, wherein a drain of the normally-on transistor is connected to the drain terminal, a source of the normally-off transistor is connected to the source terminal, and a source of the normally-on transistor and a drain of the normally-off transistor are connected to each other.

3. The cascode switch circuit of claim 1, wherein the level shifter sets a voltage between the gate and source of the normally-on transistor to about 0 V or greater.

4. The cascode switch circuit of claim 1, wherein the buffer delays the switching control signal by a changing time of the level shifter.

5. The cascode switch circuit of claim 4, wherein the buffer further delays the switching control signal by a delay time due to the first resistor.

6. The cascode switch circuit of claim 5, wherein the delay time of the buffer may be adjusted in an analog manner or a digital manner.

7. The cascode switch circuit of claim 1, wherein a magnitude of the first resistor is set such that a switching transition time of the normally-on transistor coincides with a switching transition time of the normally-off transistor.

8. The cascode switch circuit of claim 7, wherein the first resistor is a variable resistor.

9. The cascode switch circuit of claim 1, further comprising:
   at least one first transistor identical to the normally-on transistor and connected to the normally-on transistor in parallel; and
   at least one second transistor identical to the normally-off transistor and connected to the normally-off transistor in parallel.

10. The cascode switch circuit of claim 1, further comprising:
    a first clamp circuit configured to limit a voltage level between the gate and a source of the normally-on transistor; and
    a second clamp circuit configured to limit a voltage level between the gate and a source of the normally-off transistor.

11. The cascode switch circuit of claim 10, wherein the first clamp circuit comprises:
    a second resistor connected to the gate of the normally-on transistor;
    a first zener diode comprising a first anode and a first cathode, the first anode being connected to the second resistor; and
    a second zener diode comprising a second anode and a second cathode, the second anode being connected to the source of the normally-on transistor and the second cathode being connected to the first cathode, and
    the second clamp circuit comprises:
    a third resistor connected to the gate of the normally-off transistor;
    a third zener diode comprising a third anode and a third cathode, the third anode being connected to the third resistor; and
    a fourth zener diode comprising a fourth anode and a fourth cathode, the fourth anode being connected to the source of the normally-off transistor and the fourth cathode being connected to the third cathode.

12. The cascode switch circuit of claim 10, further comprising:
    at least one first transistor identical to the normally-on transistor and connected to the normally-on transistor in parallel; and
    at least one second transistor identical to the normally-off transistor and connected to the normally-off transistor in parallel.

13. The cascode switch circuit of claim 12, further comprising:

at least one third clamp circuit configured to limit a voltage level between a gate and a source of the at least one third transistor; and at least one fourth clamp circuit configured to limit a voltage level between a gate and a source of the at least one fourth transistor.

14. The cascode switch circuit of claim 1, wherein the normally-on transistor comprises gallium nitride (GaN) or silicon carbide (SiC), and the normally-off transistor comprises silicon (Si).

* * * * *